United States Patent [19]
Takeuchi et al.

[11] Patent Number: 5,798,168
[45] Date of Patent: Aug. 25, 1998

[54] METHOD OF PRODUCING CERAMIC DIAPHRAGM STRUCTURE HAVING CONVEX DIAPHRAGM PORTION AND DIAPHRAGM STRUCTURE PRODUCED BY THE SAME METHOD

[75] Inventors: Yukihisa Takeuchi, Aichi-ken; Tsutomu Nanataki, Toyoake; Hideo Masumori, Anjo; Katsuyuki Takeuchi, Nagoya, all of Japan

[73] Assignee: NGK Insulators, Ltd., Japan

[21] Appl. No.: 738,322

[22] Filed: Oct. 25, 1996

Related U.S. Application Data

[62] Division of Ser. No. 521,988, Aug. 31, 1995, Pat. No. 5,634,999.

[30] Foreign Application Priority Data

Sep. 6, 1994 [JP] Japan ................. 6-212444

[51] Int. Cl.⁶ ........................... B32B 3/10
[52] U.S. Cl. .......... 428/174; 428/49; 428/138; 428/212
[58] Field of Search ............ 428/138, 49, 174, 428/210, 212, 325, 219; 156/89.1; 310/324

[56] References Cited

U.S. PATENT DOCUMENTS

| | | | |
|---|---|---|---|
| 4,894,635 | 1/1990 | Yajima et al. | 338/2 |
| 5,089,455 | 2/1992 | Ketcham et al. | 501/104 |
| 5,210,455 | 5/1993 | Takeuchi et al. | 310/328 |
| 5,321,989 | 6/1994 | Zimmer et al. | 73/724 |
| 5,545,461 | 8/1996 | Takeuchi et al. | 428/128 |

FOREIGN PATENT DOCUMENTS

| | | |
|---|---|---|
| 0 606 767 A1 | 7/1994 | European Pat. Off. |
| 60-111600 | 6/1985 | Japan. |
| 62-213399 | 9/1987 | Japan. |
| 2161647 | 1/1986 | United Kingdom. |
| 40 04 179 A1 | 8/1991 | United Kingdom. |

*Primary Examiner*—Donald Loney
*Attorney, Agent, or Firm*—Wall Marjama & Bilinski

[57] ABSTRACT

A method of producing a ceramic diaphragm structure, including a ceramic substrate having at least one window, and a ceramic diaphragm plate superposed on the ceramic substrate to close the window or windows. The method includes the steps of: firing the diaphragm plate with the ceramic substrate to form an integral sintered body, such that the diaphragm plate provides at least one diaphragm portion aligned with the window or windows; protruding each diaphragm portion outwards, in a direction away from the corresponding window, so that the diaphragm portion is formed into a convex shape; and controlling the amount of protrusion of the diaphragm portion, by pressing a jig having a flat surface or a concave surface, against a top part of the diaphragm portion having the convex shape, so that at least the top part has a flat surface or a curved surface having a predetermined radius of curvature.

5 Claims, 8 Drawing Sheets

METHOD OF PRODUCING CERAMIC DIAPHRAGM STRUCTURE HAVING CONVEX DIAPHRAGM PORTION AND DIAPHRAGM STRUCTURE PRODUCED BY THE SAME METHOD

This is a Division of application Ser. No. 08/521,988 filed Aug. 31, 1995, now U.S. Pat. No. 5,634,999.

BACKGROUND OF THE INVENTION

1. Field of the Invention

The present invention relates to a ceramic diaphragm structure, and a method of producing the diaphragm structure, and more particularly to a ceramic diaphragm structure which has a thin, convex ceramic diaphragm portion that protrudes outwards, and exhibits excellent operating characteristics. In particular, the invention is concerned with a method of effectively controlling an amount of protrusion of the ceramic diaphragm portion, and such a ceramic diaphragm structure as obtained according to the method.

2. Discussion of Related Art

A diaphragm structure has been widely used for various kinds of sensors and the like, which structure has a substrate or base with at least one window or opening formed therethrough, and a thin diaphragm plate formed of a flexible material, for closing the window or windows thereby to provide a diaphragm portion or portions. In recent years, the diaphragm structure of this type has been increasingly used for piezoelectric/electrostrictive actuators. When the diaphragm structure is used as a component of a sensor, the sensor has appropriate means for detecting the amount of bending or flexural displacement of the diaphragm portion of the diaphragm structure, which displacement is caused by an object to be measured by the sensor. When the diaphragm structure is used as a component of a piezoelectric/electrostrictive actuator, the diaphragm portion of the structure is deformed or deflected by a piezoelectric/electrostrictive element formed on the diaphragm portion, so as to raise the pressure in a pressure chamber which is formed within the diaphragm structure.

The diaphragm structure as described above may be produced by forming an integral body which consists of the substrate serving as a base or support, and a film member (diaphragm plate) which is supported by the substrate and provides the diaphragm portion. For improved operating reliability, and increased heat and corrosion resistance, it has been proposed to form the diaphragm structure as a fired integral ceramic body, for use in a pressure sensor or a piezoelectric/electrostrictive actuator, as disclosed in U.S. Pat. No. 4,894,635 (corresponding to JP-A-63-292032) and U.S. Pat. No. 5,210,455 (corresponding to JP-A-5-49270) both owned by the assignee of the present application.

The integral ceramic diaphragm structure as described above is generally formed by laminating a ceramic green substrate having a window of a suitable shape, with a thin ceramic green sheet for closing the window, to thus form an integral green laminar structure having a diaphragm portion which closes the window at one of its opposite openings. The green laminar structure is then fired into the integral diaphragm structure. The inventors of the present invention found that the diaphragm portion, which is formed from the ceramic green sheet at its portion located above the window of the ceramic green substrate, may be concavely deformed or dented, or suffer from cracks, during the firing operation. The denting and cracking at the diaphragm portion are detrimental to the intended functions and operation of the diaphragm, resulting in reduced operating reliability.

The ceramic diaphragm structure as described above is normally provided with a flat diaphragm portion or portions. However, it is difficult to significantly increase the natural resonance frequency of such a flat diaphragm. Further, the flat diaphragm does not exhibit sufficiently high mechanical strength with respect to a force applied to the outer surface of the diaphragm, thus making it difficult to reduce the thickness of the diaphragm. Moreover, electrode films, piezoelectric/electrostrictive film and others formed on the flat diaphragm portion cannot be satisfactorily sintered.

To solve the above problems, the present inventors proposed a ceramic diaphragm structure as disclosed in a co-pending U.S. patent application Ser. No. 08/386,677, which includes a ceramic substrate having at least one window, and a ceramic diaphragm plate which is superposed on the ceramic substrate so as to close the window or windows. The ceramic substrate and the diaphragm plate are co-fired into an integral sintered body, such that the diaphragm plate includes at least one diaphragm portion which is aligned with the window(s). In the disclosed structure, each diaphragm portion protrudes outwards, in a direction away from the corresponding window, to form a convex shape. The convex diaphragm portion thus formed is free from denting and cracking, and exhibits an increased natural resonance frequency and high mechanical strength. Further, the convex diaphragm portion does not affect sintering of films (i.e., electrode films and piezoelectric/electrostrictive layer) formed on the outer surface thereof, assuring high operating reliability of the resultant ceramic diaphragm structure.

The convex shape of the diaphragm portion of the above ceramic diaphragm structure may be achieved by various methods, such as: a) controlling the sintering speed and shrinkage percentage of the diaphragm portion and the ceramic substrate, or b) applying a pressure to the diaphragm portion so as to protrude the diaphragm portion outwards, or c) making use of a difference in the coefficient of thermal expansion between the diaphragm portion and the substrate. In any of these methods, it is not easy to control the amount of protrusion of the diaphragm portion to a desired value without fail. Therefore, the amount of protrusion may fluctuate among a plurality of diaphragm portions formed in a single ceramic diaphragm structure, or among diaphragm portions of different diaphragm structures, resulting in a variation in the characteristics of the respective diaphragm portions.

SUMMARY OF THE INVENTION

It is therefore a first object of the present invention to provide a method of producing a ceramic diaphragm structure having at least one convex diaphragm portion which protrudes outwards, by an amount that is easily and advantageously controlled to a target value, assuring high uniformity in the amounts of protrusion of individual diaphragm portions, thereby to reduce a variation in the characteristics of these diaphragm portions.

It is a second object of the present invention to provide a ceramic diaphragm structure which has at least one convex diaphragm portion that protrudes outwards, and which makes it easy to control the thickness of thin or thick films of a piezoelectric/electrostrictive unit, for example, to be formed on the outer surface of the diaphragm portion.

The first object may be accomplished according to a first aspect of the present invention, which provides a method of producing a ceramic diaphragm structure including a ceramic substrate having at least one window, and a ceramic diaphragm plate which is superposed on the ceramic substrate so as to close the at least one window, comprising the steps of: firing the diaphragm plate with the ceramic substrate to form an integral sintered body, such that the diaphragm plate provides at least one diaphragm portion which is respectively aligned with the above-indicated at least one window; protruding each diaphragm portion outwards, in a direction away from the corresponding window, so that the diaphragm portion is formed into a convex shape; and controlling an amount of protrusion of the diaphragm portion or portions, by pressing a jig having a flat surface or a concave surface, against a top part of the diaphragm portion having the convex shape, so that at least the top part has a flat surface or a curved surface having a predetermined radius of curvature.

In the above-described method according to the present invention, each diaphragm portion of the ceramic diaphragm structure is protruded outwards, to form a convex shape, and the amount of protrusion of the diaphragm portion can be easily controlled due to abutting contact of the convex diaphragm portion with the jig having a flat surface or a convex surface. Consequently, the diaphragm portion includes a top part having a flat surface or a convex surface having a larger radius of curvature than that of the convex shape. With the amount of protrusion of the diaphragm portion thus controlled to a predetermined target value, a variation in the characteristics among individual diaphragm portions or diaphragm structures can be effectively reduced.

The above-indicated step of controlling an amount of protrusion may be effected during or after formation of the convex shape of the diaphragm portion(s).

In one preferred form of the present invention, the method further includes the steps of: (a) preparing a ceramic green substrate having at least one window, which gives the ceramic substrate; (b) preparing a thin ceramic green sheet which gives the ceramic diaphragm plate; and (c) superposing the ceramic green sheet on the ceramic green substrate to close the at least one window, thereby to provide an integral green laminar structure. Further, the green laminar structure is fired into the integral sintered body, such that the ceramic green sheet provides at least one diaphragm portion which is respectively aligned with at least one window formed through the ceramic green substrate, and such that each diaphragm portion is protruded outwards during firing of the green laminar structure.

In another preferred form of the invention, the method further includes the above-described steps (a) through (c), and at least one portion of the ceramic green sheet which is respectively aligned with the at least one window of the ceramic green substrate is protruded outwards, to form a convex shape, before firing of the green laminar structure. Further, the green laminar structure is fired into the integral sintered body, such that the above-indicated portion of the ceramic green sheet having the convex shape provides the diaphragm portion which protrudes outwards, in the direction away from the corresponding window. In this case, the jig having a flat surface or a concave surface may be pressed against a top part of each portion of the ceramic green sheet having the convex shape, during firing of the integral green laminar structure, so as to control the amount of protrusion of the diaphragm portion(s) thus formed.

In a further preferred form of the invention, the method further includes the steps of: providing at least one frame having a predetermined thickness on the ceramic diaphragm plate, such that each diaphragm portion is located between the frames or opposite portions of the frame; and superposing the jig having a flat surface or a concave surface on the frame(s), so that the amount of protrusion of the diaphragm portion is controlled to a value determined by the predetermined thickness, due to abutting contact of the flat or concave surface with the diaphragm portion(s). In this case, a ceramic green layer which gives the frame may be formed on an appropriate portion of a ceramic green sheet which gives the ceramic diaphragm plate after firing.

In another preferred form of the invention, the method further includes the steps of: providing the jig having a flat surface or a concave surface with a plurality of legs; and superposing the jig provided with the legs on the ceramic diaphragm plate, so that the amount of protrusion of the at least one diaphragm portion is controlled due to abutting contact of the flat or concave surface with the diaphragm portion(s) through the legs.

The second object may be attained according to a second aspect of the invention, which provides a ceramic diaphragm structure comprising: a ceramic substrate having at least one window; and a ceramic diaphragm plate which is superposed on the ceramic substrate so as to close the window or windows, the diaphragm plate being fired with the ceramic substrate to form an integral sintered body. The diaphragm plate includes at least one diaphragm portion which is respectively aligned with the window or windows, and each diaphragm portion protrudes outwards, in a direction away from the corresponding window, to form a convex shape. Each diaphragm portion has a part including the top of the convex shape, which has a flat surface or a curved surface having a predetermined radius of curvature.

In the ceramic diaphragm structure constructed as described above, each diaphragm portion protrudes outwards, in the direction away from the corresponding window, to thus form a convex shape. As compared with a conventional flat diaphragm portion, the diaphragm portion of the present structure exhibits an increased natural resonance frequency and improved mechanical strength. Further, the diaphragm portion does not affect sintering of films (such as electrode films and piezoelectric/electrostrictive layer) formed by a thick-film forming method, for example, on the outer surface of the diaphragm portion, assuring high quality and high operating reliability of the resultant ceramic diaphragm structure. Moreover, the thickness of each of the films formed by printing or other method on the diaphragm portion can be easily controlled, due to the presence of the flat surface or slightly curved surface of the top part of the convex diaphragm portion, thus assuring high uniformity in the thicknesses of the films.

The ceramic diaphragm structure as described above may be favorably used for piezoelectric/electrostrictive film elements, assuring remarkably improved operating reliability of the film elements. Thus, the diaphragm structure may be advantageously used for actuators, display devices, filters, microphones, sounding bodies (such as loudspeakers), various sensors, various vibrators and resonators.

In one preferred form of the above aspect of the invention, the ceramic diaphragm plate is formed of a material which contains a major component that is selected from the group consisting of stabilized zirconia, partially stabilized zirconia, alumina, and mixtures thereof.

Preferably, the ceramic substrate and the ceramic diaphragm plate have an average crystal grain size of not larger than 5 μm, and the diaphragm portion has a thickness of not greater than 30 μm. and consists of a dense body having a relative density (bulk density/theoretical density) of at least 90%.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1A:
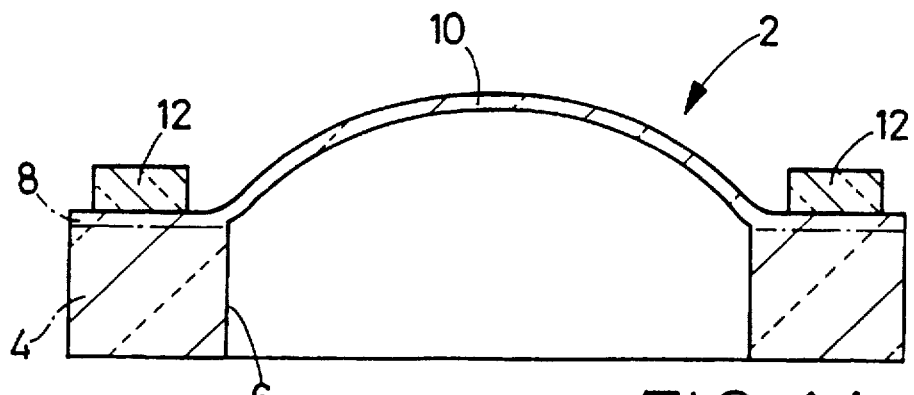
FIGS. 1A–1C are views showing one embodiment of the method of producing a ceramic diaphragm structure of the present invention.
Figure 1B:
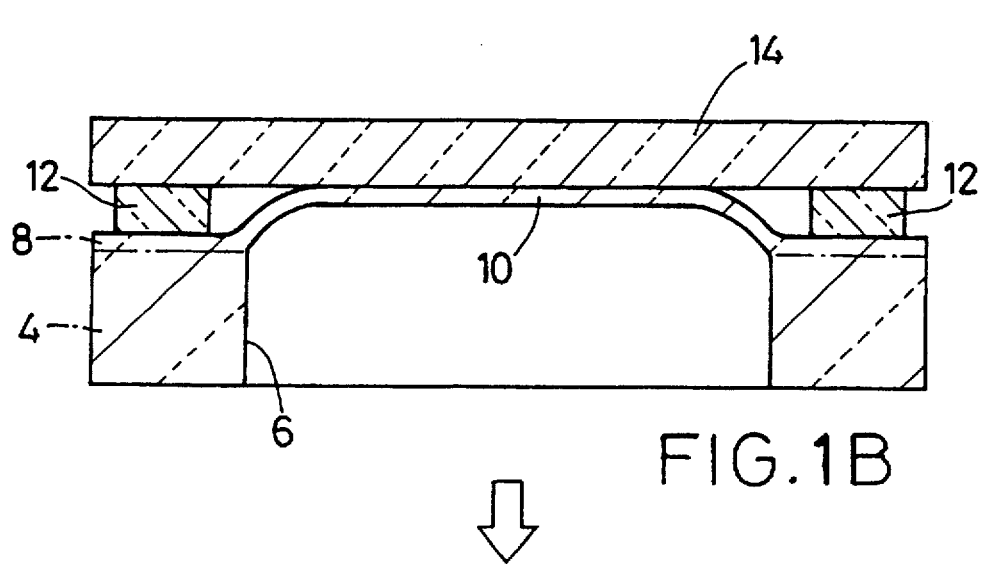
Figure 1C:
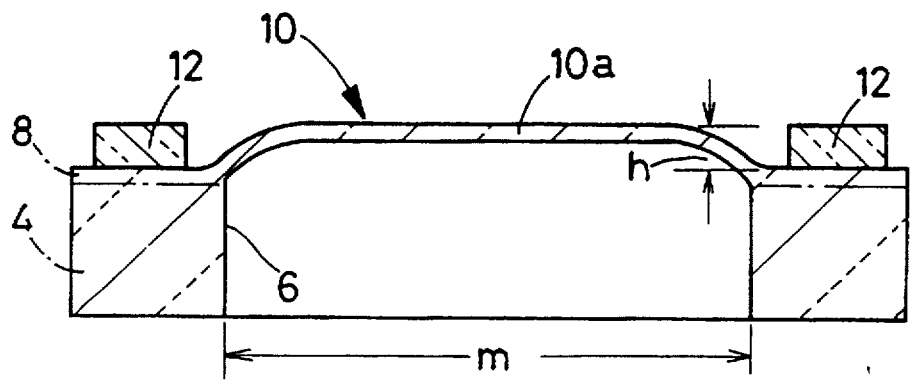

Upon producing a ceramic diaphragm structure having a ceramic substrate, and a thin diaphragm portion formed integrally with the substrate so as to close its window, the diaphragm portion is protruded outwards, to form a convex shape, with a top part of the convex diaphragm portion being flattened or formed with a convex surface having a relatively large radius of curvature, due to its abutting contact with a jig having a flat surface or a concave surface as described later. In this manner, the amount of protrusion of the diaphragm portion can be easily controlled with high accuracy. Referring to FIGS. 1A through 1C, there will be described a method of producing a ceramic diaphragm structure as one preferred embodiment of the present invention. In this embodiment, the diaphragm structure has only one window formed through the ceramic substrate.

Referring first to FIG. 1A, a ceramic diaphragm structure 2 has a ceramic substrate or base having a rectangular window 6 of a suitable size, and a thin ceramic diaphragm plate 8 which is superposed on one of opposite major surfaces of the ceramic substrate 4, so as to close one of the opposite openings of the window 6. The diaphragm plate 8 includes a diaphragm portion 10 which is aligned with the window 6 of the ceramic substrate 4, as viewed in the plane of the diaphragm plate 8. The diaphragm portion 10 is protruded outwards, in a direction away from the window 6, to assume a convex shape as shown in FIG. 1A, by various methods, such as a) controlling the sintering speed and shrinkage percentage of the ceramic substrate 4 and diaphragm plate 8 of the diaphragm structure 2, or b) applying a pressure to the diaphragm plate 8 prior to firing, so as to achieve the convex shape of the diaphragm portion 10, or c) making use of a difference in the coefficient of thermal expansion between the substrate 4 and the diaphragm plate 8. The ceramic diaphragm structure 2 as shown in FIG. 1A will be further processed in later steps for controlling the amount of protrusion of the diaphragm portion 10 by means of a flattening jig. A pair of frame portions 12, 12 having a predetermined thickness are formed integrally on the ceramic diaphragm plate 8, such that the convex diaphragm portion 10 (corresponding to the window 6) is interposed between the frame portions 12, 12. The frame portions 12 are formed of the same kind of ceramic material as the ceramic diaphragm plate 8.

Subsequently, a ceramic plate 14 serving as the flattening jig is positioned above the diaphragm structure 2, such that a flat abutting surface of the plate 14 is opposed to the diaphragm portion 10. Then, the ceramic plate 14 is pressed against the diaphragm portion 10 at an elevated temperature, until the plate 14 abuts on the frame portions 12, 12 on the opposite sides of the diaphragm portion 10, as shown in FIG. 1B. Due to the pressure applied from the flat abutting surface of the ceramic plate 14, a top part of the convex diaphragm portion 10 is deformed or flattened, so as to form a flat portion 10a as shown in FIG. 1C. The height "h" of the flat portion 10a thus formed is substantially determined by the thickness of the frame portions 12 formed on the opposite sides of the diaphragm portion 10.

With the flat portion 10a formed by pressing and deforming the top part of the convex diaphragm portion 10 of the diaphragm structure 2 due to its abutting contact with the ceramic plate 14 as the flattening jig, the amount "h" of protrusion of the convex diaphragm portion 10 can be effectively and easily controlled to a predetermined target value. The target value may also be easily established since the amount "h" of protrusion of the convex diaphragm portion 10 is determined by the thickness of the frame portions 12. This effectively reduces a variation in the characteristics of individual ceramic diaphragm structures (2) due to fluctuation of the amounts "h" of protrusion of diaphragm portions (10) thereof. In the case of a ceramic diaphragm structure having a plurality of diaphragm portions, a variation in the characteristics of the diaphragm portions due to fluctuation of the amounts of protrusion thereof can also be advantageously reduced.

With respect to the diaphragm structure 2 having the flat portion 10a formed by flattening the top part of the convex diaphragm portion 10, films constituting a piezoelectric/electrostrictive unit are formed by printing, for example, on the outer surface of the flat portion 10a of the diaphragm portion 10. In this case, the thicknesses of these films can be easily controlled to desired values, without suffering from fluctuation of the thicknesses of peripheral portions of the films due to flow of film materials at the peripheral portions, as encountered when the films are formed on a curved surface. Thus, the flat portion 10a of the diaphragm portion 10 assures improved uniformity of the thicknesses of the films formed thereon.

Figure 2A:
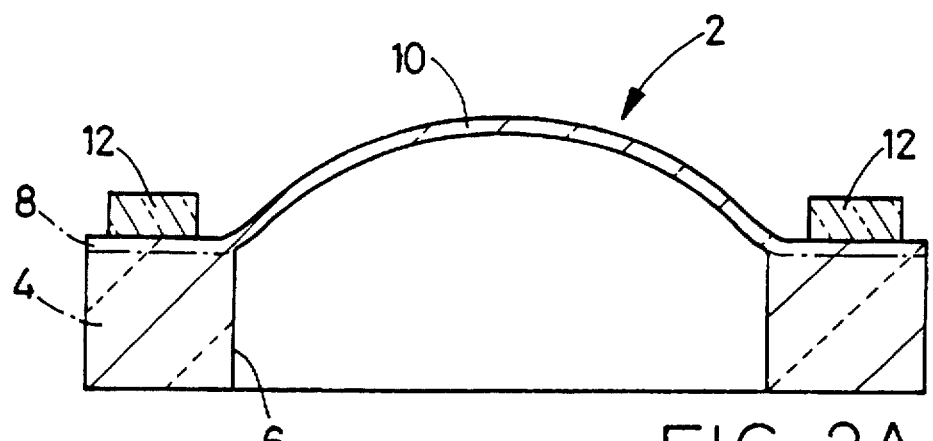
FIGS. 2A–2C are views showing another embodiment of the method of producing a ceramic diaphragm structure of the present invention.
Figure 2B:
Figure 2B:
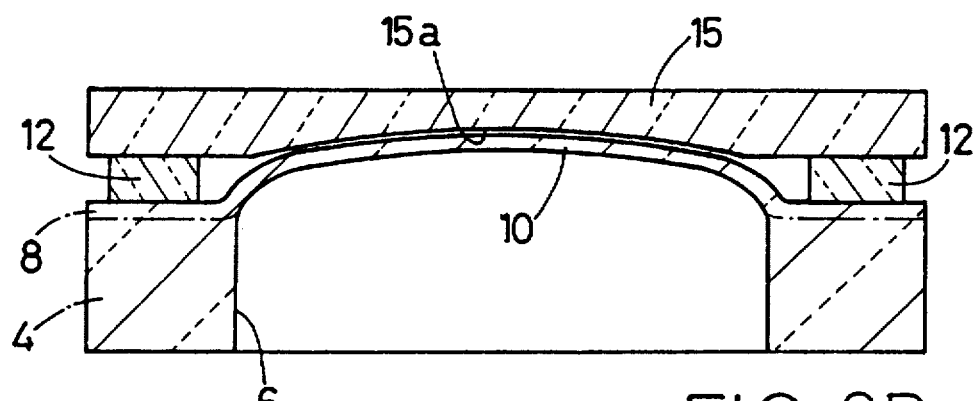
Figure 2C:
Figure 2C:
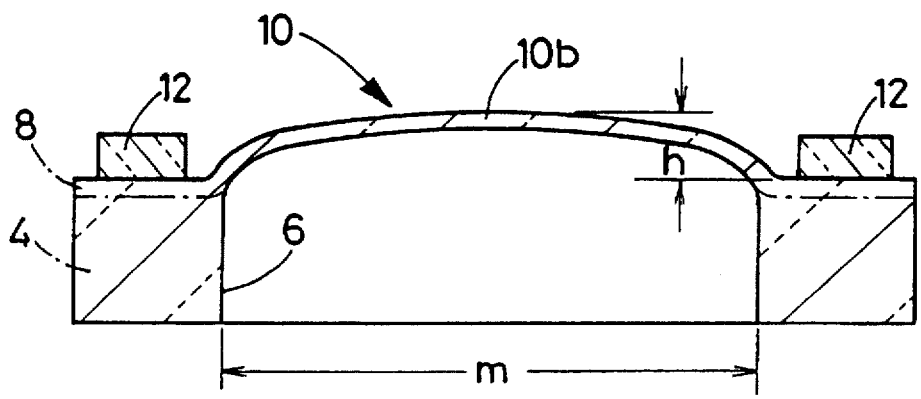

The flattening jig 14 as described above may be replaced by a curving jig having a concave surface, in the form of a ceramic plate 15 with a concave abutting surface 15a having a larger radius of curvature than the convex surface of the diaphragm portion 10 as shown in FIG. 2A. With the ceramic plate 15 pressed against the diaphragm portion 10, in the manner as described above, a curved portion 10b having the same radius of curvature as the concave abutting surface 15a is formed, to yield the same effects as described above. In particular, the convex shape of the diaphragm portion 10 as shown in FIG. 2C is advantageous over that as shown in FIG. 1C, since the curved outer surface of the diaphragm portion 10 does not affect sintering of electrode films and piezoelectric/electrostrictive film formed thereon.

The concave abutting surface 15a of the jig 15 has a radius of curvature (as measured in the plane including the shortest line (m) which passes the center of the window 6 of the ceramic substrate 4), which is larger than the radius of curvature of the convex diaphragm portion 10 as seen in FIG. 2A, prior to control of the amount of protrusion of this portion 10. Further, it is desirable that the radius of curvature of the concave abutting surface 15a be not smaller than 50 μm, preferably, not smaller than 200 μm. Accordingly, it is also desirable that the radius of curvature of the curved surface 10b formed by the jig 15 as measured in the above-indicated plane including the shortest line (m) be not smaller than 50 μm, preferably, not smaller than 200 μm.

The controlled amount "h" of protrusion of the diaphragm portion 10 may be suitably determined depending upon the specific application or usage of the diaphragm structure 2. To sufficiently assure the effects accruing from the convex shape of the diaphragm portion 10, the percentage of the amount "h" of protrusion of a central part of the diaphragm portion 10 (or maximum protrusion amount) with respect to the length "m" of the shortest line which passes the center of the window 6 of the ceramic substrate 4, in other words, protrusion percentage as represented by [y=(h/m)×100], is generally controlled to be not smaller than 1%. The upper limit of the protrusion percentage (y), which may be suitably determined, is generally about 50%. Preferably, the protrusion percentage (y) may be held in the range of about 2–10%. The desired protrusion percentage (y) can be achieved by suitably determining the thickness of the frame portions 12.

In producing the diaphragm structure 2 constructed as described above, materials for forming the ceramic substrate 4 and ceramic diaphragm plate 8 are suitably selected from various known ceramic materials. Generally, the ceramic diaphragm plate 8 is formed of a material having a major component selected from mullite, spinel, silicon carbide, silicon nitride, cordierite, aluminum nitride, titania, beryllia, stabilized zirconia, partially stabilized zirconia, alumina, and mixtures thereof. Among these ceramic materials, stabilized zirconia, partially stabilized zirconia, alumina, or a mixture thereof is desirably employed. Particularly favorably used is a material as disclosed by the present inventors in JP-A-5-270912, which contains as a main component zirconia which is partially stabilized by adding yttria or other compound, and which has a crystal phase that consists essentially of a tetragonal phase or a combination of at least two kinds of cubic, tetragonal and monoclinic phases. The diaphragm plate 8 made of the above-described material exhibits high mechanical strength, and high degrees of heat resistance and corrosion resistance, and is highly flexible with a small thickness, thereby to provide a desirable diaphragm structure. To achieve the integrity of the diaphragm structure 2, the ceramic substrate 4 is desirably formed of one of the above-described materials as used for the ceramic diaphragm plate 8. However, the substrate 4 may also be formed of other ceramic material, such as glass ceramic.

To assure sufficiently high mechanical strength of the diaphragm structure 2, the ceramic materials for the ceramic substrate 4 and the ceramic diaphragm plate 8 (diaphragm portion 10) desirably have the crystal grain size of 5 μm or smaller, preferably, 3 μm or smaller, and more preferably, 1 μm or smaller. The ceramic diaphragm plate 8 which provides the thin diaphragm portion 10 corresponding to the window 6 of the ceramic substrate 4 may consist of either a single layer or a plurality of sub-layers. The thickness of this diaphragm plate 8 is desirably controlled to be not greater than 30 μm, preferably, in the range of 3 to 20 μm, in view of its vibrating characteristics. It is also desirable to determine the density of the diaphragm plate 8 such that the relative density (bulk density/theoretical density) is 90% or higher, preferably, 95% or higher, and more preferably, 98% or higher, in view of the strength, Young modulus and other characteristics of the diaphragm material.

The thickness and sinterability of the ceramic substrate 4 of the diaphragm structure 2 are not limited to any particular range, but may be appropriately determined depending upon the specific application or usage of the diaphragm structure 2. While the ceramic substrate 4 may consist of either a single layer or a plurality of sub-layers, the substrate 4 is preferably formed of the same or similar ceramic material as used for the diaphragm plate 8, to ensure increased reliability at the interface between the substrate and plate 4, 8.

The shape of the window 6 of the diaphragm structure 2, in other words, the shape of the diaphragm portion 10 is by no means limited to the rectangular shape as shown in the present embodiment, but may be suitably selected depending upon the application or use of the diaphragm structure 2. For example, the diaphragm portion 10 may have a circular, polygonal or elliptical shape, or a combination of such different shapes.

Figure 3:
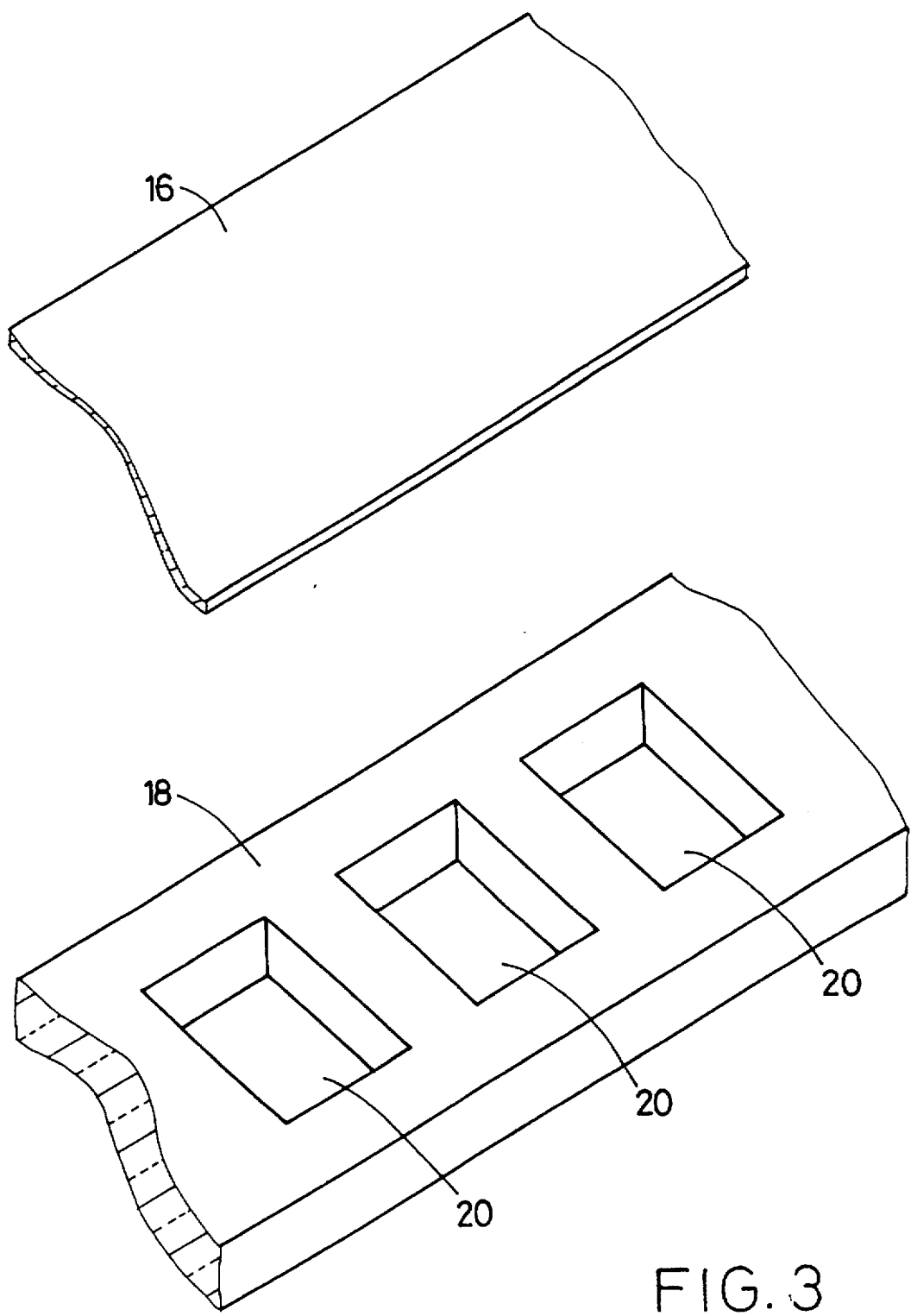
FIG. 3 is a view showing examples of a ceramic green sheet and a ceramic green substrate used for producing the diaphragm structure according to the present invention.

The ceramic diaphragm structure 2 constructed as described above may be produced by one of various methods known to those skilled in the art. When a plurality of diaphragm portions are formed in the diaphragm structure 2, for example, a thin ceramic green sheet 16 which gives the ceramic diaphragm plate 8 is superposed on a ceramic green substrate 18 which gives the ceramic substrate 4, so as to close windows 20 formed through the green substrate 18, as shown in FIG. 3. Each of the ceramic green sheet 16 and the ceramic green substrate 18 may consist of a single sheet or a plurality of sheets having smaller thickness. Then, the ceramic green sheet and substrate 16, 18 are bonded to each other by thermo compression, so as to provide an integral green laminar structure, which is then fired into the integral diaphragm structure. While the diaphragm portions may be protruded outwards, in the direction away from the corresponding windows 20, by any one of various methods known to those skilled in the art, the diaphragm structure having such diaphragm portions may be advantageously produced by a method according to the present invention, which includes the following process steps (a) through (d):

Initially, the ceramic green substrate 18 having at least one window 20 is prepared in the first step (a), and the ceramic green sheet 16 having a relatively small thickness is prepared in the second step (b), as shown in FIG. 3. The ceramic materials as described above may be suitably used for forming the ceramic green sheet 16 and ceramic green substrate 18. In particular, the ceramic green sheet 16 is preferably formed of a material which contains a major component selected from partially stabilized zirconia, fully stabilized zirconia, alumina and mixtures thereof, or a material which gives one of the above-indicated materials after firing thereof. The ceramic material for the green sheet 16 is in the form of a powder having the average particle size of 0.05 to 1.0 μm. The ceramic powder may be advantageously subjected to heat treatment at a temperature of 300° C. to 1200° C., prior to formation of a slurry or paste as described later, so as to suitably control the shrinkage percentage of the green sheet 16 after firing thereof. The ceramic materials for the green sheet 16 and green substrate 18 are then mixed with a suitable binder, plasticizer, dispersing agent, sintering aid, organic solvent and others, in a known manner, to prepare slurries or pastes. Then, the slurries or pastes are formed into the ceramic green sheet 16 and ceramic green substrate 18 having predetermined thicknesses, by a known method using a doctor blade machine, calender roller, or a reverse roll coater, or by printing, for example. If necessary, a plurality of thin green sheets may be laminated or stacked together, or initially prepared green sheets may be cut, machined, punched or otherwise processed, to provide the green sheet and substrate 16, 18 having desired thicknesses and shapes.

In the third step (c), the thus prepared ceramic green sheet 16 and ceramic green substrate 18 are superposed on each other, to provide a green laminar structure. More specifically, the relatively thin ceramic green sheet 16 is superposed on the ceramic green substrate 18 so as to close the windows 20, and bonded thereto by thermocompression, thereby to form the integral green laminar structure.

In the next step (d), the integral green laminar structure thus obtained is fired into an integral sintered body which has thin diaphragm portions (10) formed in alignment with the windows 20 of the ceramic green substrate 18. Upon firing of the green laminar structure, the diaphragm portions (10) are protruded outwards, that is, in the direction away from the windows 20 (6), to form a convex shape as shown in FIG. 1A. The firing temperature is generally controlled to be in the range of 1200° C. to 1700° C., preferably, in the range of 1300° C. to 1600° C.

To cause the diaphragm portions (10) of the ceramic green sheet 16 to protrude outwards upon firing of the integral green laminar structure, the sintering speed and shrinkage percentage of the green sheet 16 and green substrate 18 are controlled by suitably selecting the ceramic materials for the green sheet and substrate 16, 18, the particle sizes of powders of the selected ceramic materials, and kinds and amounts of the binder, dispersing agent, sintering aid and other additives, so that the diaphragm portions (10) formed from the ceramic green sheet 16 are curved outwards upon firing of the green laminar structure.

The ceramic diaphragm structure having convex diaphragm portions may also be produced by another method which includes the above-described steps (a) through (c), and the following process steps (e) and (f). That is, the integral green laminar structure as obtained in the step (c) is processed in the next step (e), such that portions of the ceramic green sheet 16 which are aligned with the windows 20 of the ceramic green substrate 18 are protruded outwards, in the direction away from the windows 20. In the following step (f), the green laminar structure with the green sheet 16 having the convex portions is fired into an integral sintered body, such that the convex portions of the green sheet 16 provide the convex diaphragm portions (10) which protrude outwards and which are aligned with the windows of the ceramic substrate of the sintered body.

In the process step (e) of the above-described method, each of the convex portions of the ceramic green sheet 16 aligned with the windows 20 may be formed by applying a mechanical force to the relevant portion of the green sheet 16, with a suitable jig inserted into the corresponding window 20, or by applying a fluid pressure from the inside of the window 20, or by applying a negative pressure to the outer surface of the relevant portion of the green sheet 16. In such manners, the portions of the ceramic green sheet 16 corresponding to the windows 20 can be easily protruded outwards, to form a convex shape.

In the embodiments as shown in FIGS. 1A-1C and 2A-2C, the amount of protrusion or height "h" of the convex diaphragm portion 10 of the ceramic diaphragm structure 2 is controlled to a desired value, due to abutting contact of the diaphragm portion 10 with the ceramic plate 14, 15 as the flattening jig or curving jig. The frame portions 12, 12 having a thickness equal to the desired height "h" are disposed on appropriate portions of the ceramic diaphragm plate 8 in a suitable manner, so as to control the height "h" of the diaphragm portion 10. Typically, the frame portions 12 are formed by printing or green sheets for the frame portions 12 are superposed, on the appropriate portions of the ceramic green sheet 16 which gives the ceramic diaphragm plate 8. More specifically, ceramic green layers which give the frame portions 12 may be formed on the appropriate portions of the ceramic green sheet 16, which is then superposed on the ceramic green substrate 18, to thus provide an integral green laminar structure. Alternatively, the ceramic green sheet 16 and ceramic green substrate 18 may be first formed into an integral laminar structure, and then ceramic green layers which give the frame portions 12 may be formed by printing or superposed on the appropriate portions of the ceramic green sheet 16 of the integral laminar structure. Upon firing of the integral laminar structure obtained in either of the above two methods, the ceramic green layers are fired so as to provide the frame portions 12 formed integrally on the ceramic diaphragm plate 8.

The position, shape and other details of the frame portions 12 can be selected as desired, provided the frame portions 12 are disposed on the ceramic diaphragm plate 8 such that at least one diaphragm portion 10 is interposed between the frame portions 12 which are located on at least the opposite sides of the diaphragm portion or portions 10. For example, the frame portion(s) may be disposed so as to surround the diaphragm portion 10 (or window 6), or two independent frame portions 12, 12 may be disposed on the opposite sides of the diaphragm portion 10. Further, the frame portion 12 may extend continuously or discontinuously over the relevant portion of the ceramic diaphragm plate 8.

While the frame portions 12 may be fixedly secured to the ceramic diaphragm plate 8, or may be detachable from the diaphragm plate 8, it is desirable that the frame portions 12 be fixed to, in particular, be formed integrally with the diaphragm plate 8, in view of the production efficiency, for example. Therefore, the ceramic green layers which give the frame portions 12 are preferably formed of the same material as the diaphragm plate 8 or ceramic substrate 4, and co-fired with the green sheet 16 for the diaphragm plate 8 to provide an integral sintered body.

The flattening jig or curving jig 14, 15 is desirably formed of a ceramic material, since the jig is subjected to heat history while being used for controlling the amount of protrusion of the diaphragm portion 10. In the present embodiments, the ceramic plate 14 serves as the flattening jig and provides a flat surface for abutting contact with the diaphragm portion 10, while the ceramic plate 15 serves as the curving jig, and provides a concave or curved surface for abutting contact with the diaphragm portion 10. With the diaphragm portion 10 pressed under the ceramic plate 14, 15 at an elevated temperature, the diaphragm portion 10 is deformed until the ceramic plate 14, 15 abuts on the frame portions 12, 12 and its movement is inhibited. In this manner, the top part of the convex diaphragm portion 10 is formed as the flat portion 10*a* or the curved portion 10*b* having a relatively large radius of curvature.

To promote the deformation of the diaphragm portion 10, the diaphragm structure 2, which is pressed under the ceramic plate 14, 15, needs to be heated to a temperature equal to or higher than the temperature which enables the diaphragm portion 10 to undergo creep deformation. Generally, the heating temperature is desirably approximate to the firing temperature of the diaphragm structure 2. Too high heating temperature results in deterioration of the properties of the diaphragm structure 2.

Figure 4A:
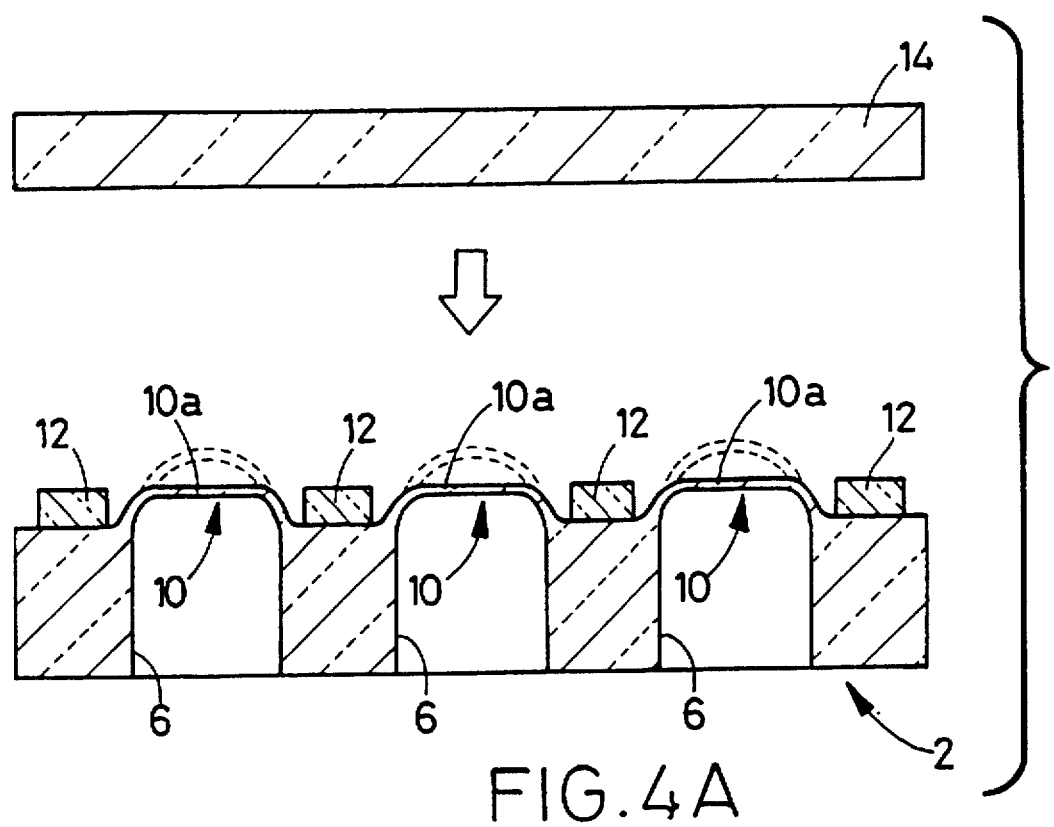
FIG. 4A is a view showing a ceramic diaphragm structure having a plurality of diaphragm portions which protrude outwards, and frame portions having the same height, together with a flattening jig for controlling the amounts of protrusion of the diaphragm portions.
Figure 4B:
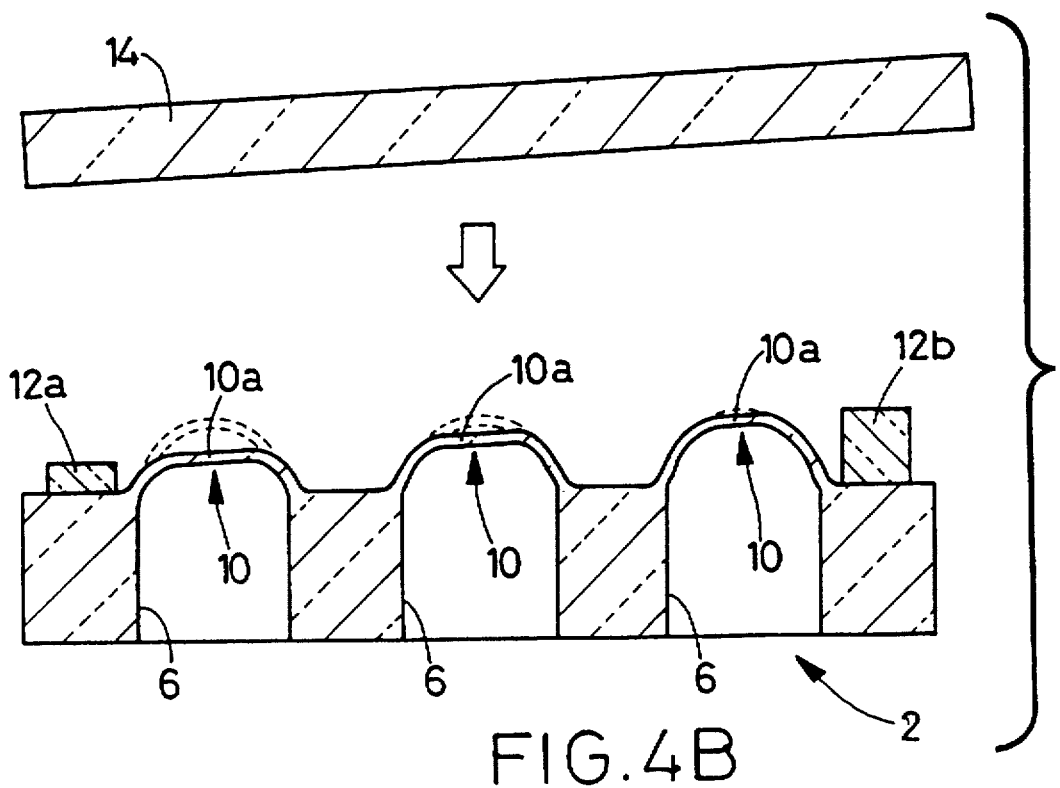
FIG. 4B is a view similar to that of FIG. 4A, showing a ceramic diaphragm structure with opposite frame portions having different heights.

Referring next to FIG. 4A and 4B, there are shown two examples of the ceramic diaphragm structure 2 having a plurality of diaphragm portions 10 which protrude outwards, by amounts which are controlled by means of the ceramic plate 14. In the example of FIG. 4A, the frame portions 12 having the same height are formed integrally with the diaphragm structure 2, such that the frame portions 12 are located on at least the opposite sides of each of the diaphragm portions 10. Then, the ceramic plate 14 is pressed against the diaphragm portions 10 at an elevated temperature, until the ceramic plate 14 is brought into abutting contact with the frame portions 12, so that the top parts of the convex diaphragm portions 10 are deformed so as to provide flat portions 10*a*. As a result of the flattening process for controlling the amount of protrusion of the diaphragm portions 10, the height "h" of the diaphragm portions 10 is made substantially equal to the height of the frame portions 12, and is thus controlled to a constant value. Since this flattening process requires only two of the frame portions 12 to be disposed on the opposite end portions of the diaphragm structure 2, the other two frame portions 12 located in the middle portion of the structure 2 can be eliminated.

In the example of FIG. 4B, two frame portions 12*a*, 12*b* having different heights are provided on the opposite end portions of the diaphragm structure 2 as viewed in the direction in which the diaphragm portions 10 (windows 6) are spaced apart from each other. Then, the ceramic plate 14 is pressed against the diaphragm portions 10 until the plate 14 is brought into abutting contact with the frame portions 12*a*, 12*b*, so that the diaphragm portion 10 located nearer to the low frame portion 12*a* is deformed by a relatively large amount, and the diaphragm portion 10 located nearer to the high frame portion 12*b* is deformed by a relatively small amount. In this manner, the diaphragm structure 2 is provided with the flat portions 10*a* having different areas, in other words, the diaphragm portions 10 having different amounts "h" of protrusion or heights. Thus, the use of the frame portions 12 having different heights for supporting the ceramic plate 14 as the flattening jig permits formation of the diaphragm portions 10 with varying amounts of protrusion, as shown in FIG. 4B.

Figure 5:
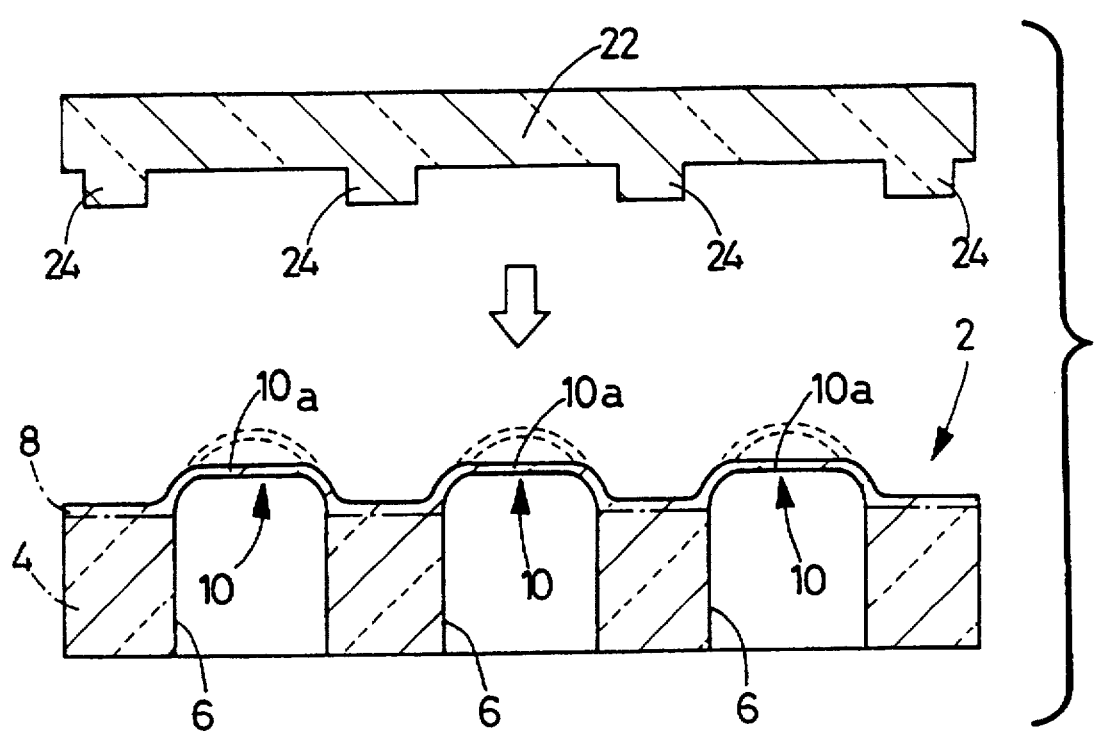
FIG. 5 is a view corresponding to that of FIG. 4A, showing another example of flattening jig having legs.

While the frame portions 12 are fixedly disposed on the diaphragm plate 8 of the ceramic diaphragm structure 2 in the above-described examples, suitable spacers and the like having the same height as the frame portions 12 may be positioned on the diaphragm plate 8, so that the amount of protrusion of the convex diaphragm portions 10 is controlled due to abutting contact of the ceramic plate 14 as the flattening jig with the spacers, for example. It is also possible to use a flattening jig which is constructed by forming the ceramic plate 14 integrally with the frame portions 12. FIG. 5 shows an example of such a flattening jig, that is, a jig 22 with a plurality of legs 24 having the same height as the frame portions 12 as described above, which legs 24 are formed as integral parts of the jig 22 on one of opposite major surfaces thereof. The jig 22 is formed of a material having high heat resistance, such as a ceramic material. The legs 24 of the jig 22 are brought into contact with the ceramic diaphragm plate 8, such that the legs 24 are located on the opposite sides of each or two or more of the diaphragm portions 10 of the diaphragm structure 2. In this manner, the top parts of the diaphragm portions 10 are deformed by the jig 22, to provide respective flat portions 10*a* having a suitably controlled amount "h" of protrusion or height.

In this case, too, the flattening process for controlling the height "h" of the convex diaphragm portions 10 requires only two of the legs 24, 24 to be disposed on the opposite end portions of the diaphragm structure 2 as viewed in the direction in which the diaphragm portions 10 are spaced apart from each other. Accordingly, the other two legs 24, 24 formed on the middle portion of the jig 22 may be eliminated. If the two legs formed on the opposite end portions of the jig have different heights, the diaphragm structure 2 is provided with the diaphragm portions 10 having varying heights or amounts or protrusion, as shown in FIG. 4B.

Figure 6:
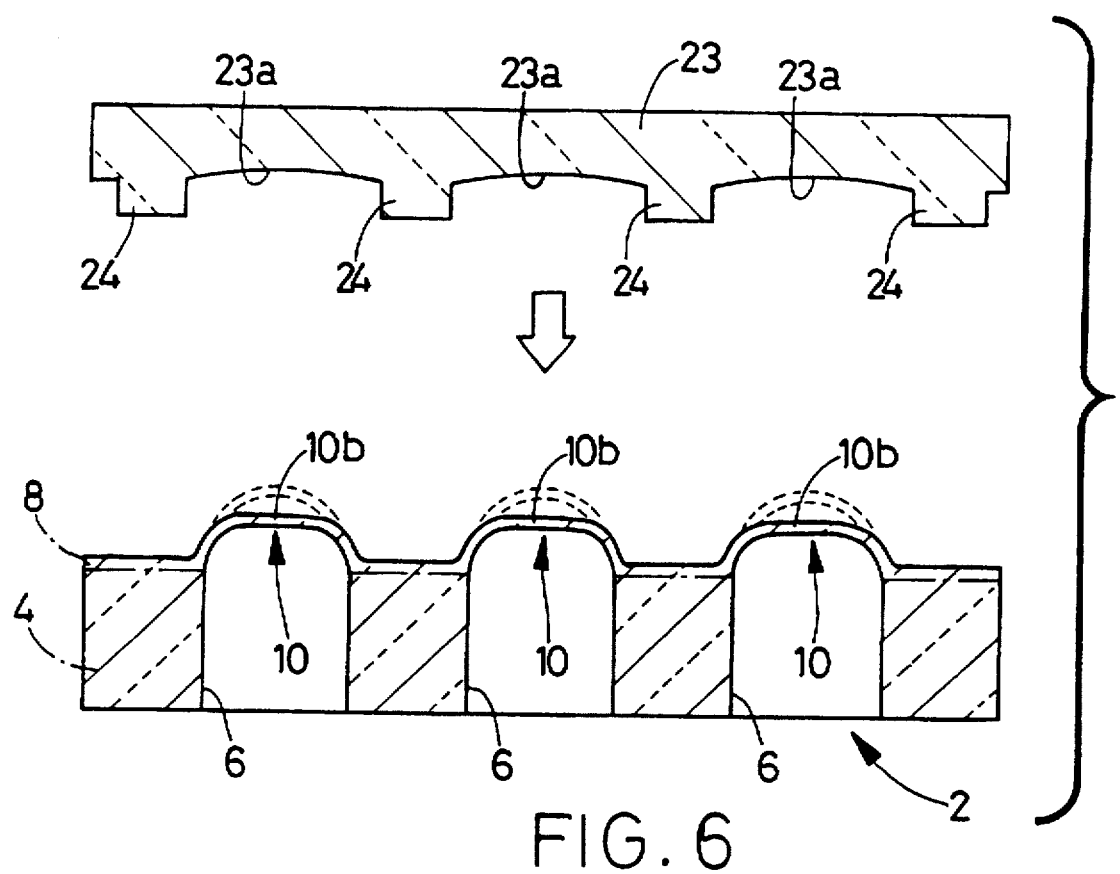
FIG. 6 is a view showing a curving jig having legs, and concave surfaces for abutting contact with diaphragm portions of a ceramic diaphragm structure.

It is also possible to use a jig 23 as shown in FIG. 6, which has a plurality of concave abutting surfaces 23*a*, and a plurality of legs 24 as integral parts thereof. With the jig 23 pressed against the diaphragm structure 2, the top parts of the convex diaphragm portions 10 are deformed as shown in FIG. 6, so as to provide respective curved portions 10*b* having a suitably controlled amount "h" of protrusion or height.

While the amount of protrusion of the convex diaphragm portions 10 is controlled by the ceramic plate 14, 15 or the jig 22, 23, after firing of the diaphragm structure 10 in the above examples, the amount of protrusion of the diaphragm portions 10 may be controlled while the diaphragm structure 2 is being fired.

More specifically, the jig 22, 23 with legs may be superposed on an integral green laminar structure consisting of the ceramic green sheet 16 and ceramic green substrate 18, or the ceramic plate 14, 15 may be superposed on the integral green laminar structure in which ceramic green layers for the frame portions 12 are formed on the ceramic green sheet 16. Upon firing of the integral green laminar structure, the amount of protrusion of the portions of the ceramic green sheet 16 which are aligned with the windows 20 is limited due to abutting contact of these portions with the jig 22, 23 or the ceramic plate 14, 15, whereby the amount of protrusion of the resulting diaphragm portions 10 is effectively controlled to a desired value.

Alternatively, the integral laminar structure of the green sheet 16 and green substrate 18, or the integral laminar structure which additionally includes the ceramic green layers for the frame portions 12, may be formed with convex portions which protrude outwards and correspond to the diaphragm portions 10 to be formed. Then, the jig 22, 23 or the ceramic plate 14, 15 is superposed on the integral green laminar structure, so that the convex portions of the laminar structure are pressed and deformed by the jig 22, 23 or ceramic plate 14, 15. In this condition, the green laminar structure is fired so as to form the diaphragm portions 10 whose amount of protrusion is controlled to a target value.

Thus, the amount of protrusion of the convex diaphragm portions 10 can be effectively controlled at the time of firing of the green laminar structure, in other words, when the shape of the diaphragm portions 10 is established by firing, due to abutting contact of the top parts of the convex portions of the laminar structure with the flattening jig, such as the ceramic plate 14 or jig 22 with legs, or the curving jig, such as the ceramic plate 15 or jig 23 with legs. That is, the flat portions 10a or curved portions 10b are formed as top parts of the diaphragm portions 10 upon firing of the green laminar structure.

Since the amount "h" of protrusion of the diaphragm portions 10 of the thus obtained ceramic diaphragm structure 2 is accurately controlled to a predetermined target value, a variation in the characteristics of individual diaphragm structures or individual diaphragm portions can be effectively reduced, thus assuring high quality and high reliability of the diaphragm structure(s). Further, the ceramic diaphragm structure 2 produced according to the present invention exhibits high mechanical strength, and facilitates control of the thickness of films formed on the outer surface of the diaphragm portion 10, due to the presence of the flat portion 10a or the curved portion 10b having a relatively large radius of curvature. Thus, the ceramic diaphragm structure 2 is advantageously used for various applications, such as sensors and actuators. Further, due to the advantageous properties of the ceramic materials used therein, the present diaphragm structure 2 may also be favorably used as a part of a device, conduit or the like which requires high corrosion resistance, together with various detecting means such as a strain gauge, so as to provide a corrosion-resistance pressure sensor adapted to monitor the internal pressure or other parameter of the device or conduit. The diaphragm structure 2 can also be used with a suitable driving source, such as air pressure or a push rod, to provide an actuator which provides a relatively large amount of displacement at a relatively low frequency.

Figure 7:
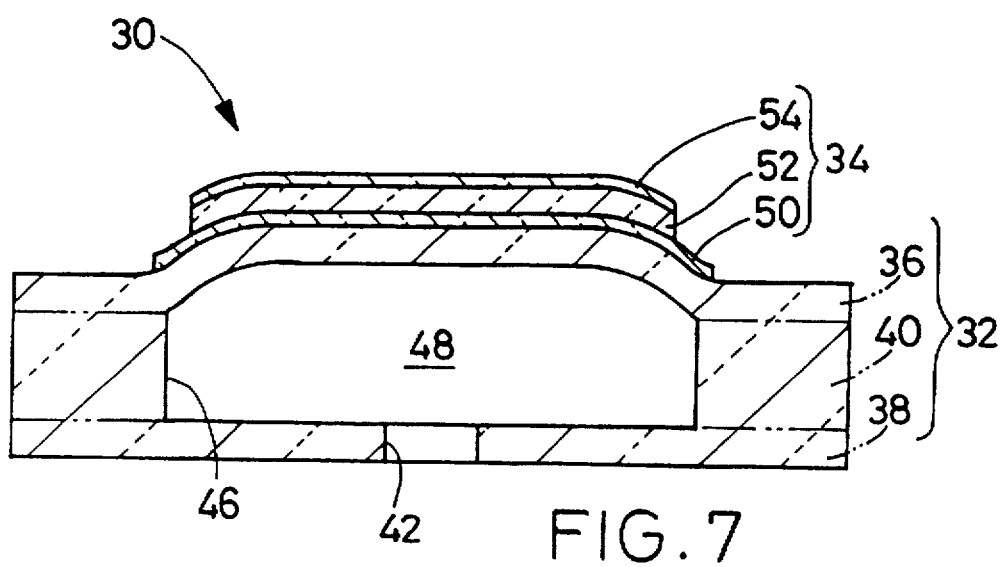
FIG. 7 is a cross sectional view showing one example of a piezoelectric/electrostrictive film element using a ceramic diaphragm structure produced according to the present invention.
Figure 8:
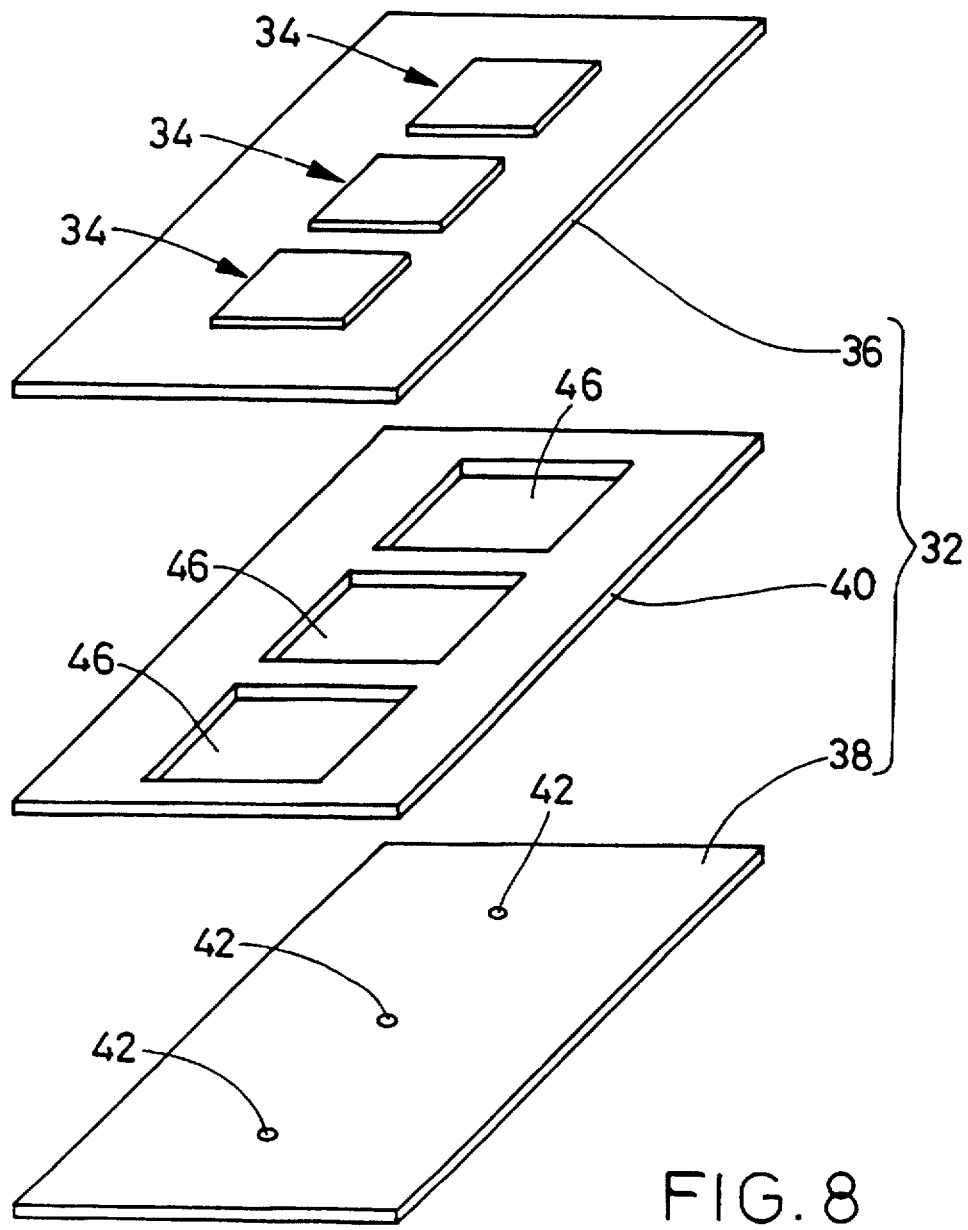
FIG. 8 is an exploded perspective view of the piezoelectric/electrostrictive film element as shown in FIG. 7.

The ceramic diaphragm structure produced according to the present invention is advantageously used for a piezoelectric/electrostrictive film element, in which a piezoelectric/electrostrictive unit is formed on one of the opposite major surfaces of the diaphragm portion of the structure. In particular, the present diaphragm structure is favorably used for uni-morph or other types of piezoelectric/electrostrictive film elements which are adapted to generate or detect displacement or force in the form of bending, deflection or flexure, and which are used for actuators, filters, display devices, acceleration sensors, shock sensors, transformers, microphones, sounding bodies (such as loudspeakers), various resonators or vibrators for power devices and communication devices. FIG. 7 schematically shows an example of a piezoelectric/electrostrictive film element including the thin ceramic diaphragm structure obtained by one of the above-described methods, and FIG. 8 is an exploded perspective view of the film element. The piezoelectric/electrostrictive film element 30 as shown in these figures has a diaphragm structure 32, and piezoelectric/electrostrictive units (hereinafter referred to as P/E units) 34 disposed on the diaphragm structure 32. More specifically, the P/E units 34 are bonded to and formed integrally on the outer surfaces of respective diaphragm portions of the structure 32. In operation, the P/E units 34 are adapted to cause deflection or deformation of the corresponding diaphragm portions of the structure 32, upon application of a voltage to the P/E units 34.

More specifically described, the diaphragm structure 32 produced according to the present invention has a laminar structure which consists of a relatively thin closure plate (diaphragm plate) 36, a connecting plate (substrate) 38, and a spacer plate (substrate) 40 which is interposed between the closure and connecting plates 36, 38. These plates 36, 38, 40 are formed of suitable ceramic materials, such as zirconia. The connecting plate 38 has a plurality of communication holes 42 (three holes 42 in this example), which are spaced apart from each other at a predetermined interval in the longitudinal direction of the plate 38, as shown in FIG. 8. These communication holes 42 communicate with an external space. The spacer plate 40 has a plurality of square windows or apertures 46 (three windows 46 in this example) formed therethrough. These windows 46 are spaced apart from each other at a predetermined interval in the longitudinal direction of the spacer plate 40. The spacer plate 40 is superposed on the connecting plate 38 such that the communication holes 42 formed through the connecting plate 38 are open to the respective windows 46. While only one communication hole 42 is provided for each of the windows 46 in this example, two or more communication holes may be provided for each window 36, depending upon the specific application of the piezoelectric/electrostrictive film element 30. The shape, position and dimensions of the communication hole 42 may also be suitably determined as desired, depending upon the application of the film element 30. The closure plate 36 is superposed on one of the opposite major surfaces of the spacer plate 40 remote from the connecting plate 38, so as to close the windows 46 of the spacer plate 40. In this arrangement, a plurality of pressure chambers 48 are formed within the diaphragm structure 32, such that the pressure chambers 48 are held in communication with the space outside the structure 32, through the respective communication holes 42.

As described above, the diaphragm structure 32 is formed as an integral fired or sintered body which is made principally of a suitable ceramic material, such as zirconia, and has diaphragm portions (36) which are aligned with the windows 46 of the spacer plate 40, and which protrude outwards, that is, in the direction away from the windows 46, to form a convex shape. Further, the amount of protrusion of the convex diaphragm portions is regulated or controlled to a target value by means of the flattening jig or curving jig, such that the top parts of the diaphragm portions are formed with flat or slightly curved surfaces. To produce the diaphragm structure 32, green sheets are initially formed by a generally used machine, such as a doctor blade machine, reverse roll coater or screen printing machine, using slurries or pastes that are prepared from suitable ceramic materials, binder and solvent, for example. Then, the green sheets are subjected to cutting, machining, punching or other process as needed, so as to form the windows 46 and communication holes 42, and thus provide precursors which give the respective plates 36, 38, 40. Then, these precursors are laminated on each other, and bonded together by thermo-compression, into an integral green laminar structure. Thereafter, the green laminar structure is fired into the integral diaphragm structure 32, such that the diaphragm portions as part of the closure plate 36 are projected or protruded outwards by one of the above-described methods, while the amount of protrusion of the convex diaphragm portions is regulated or controlled to a predetermined target value by means of the flattening jig.

The piezoelectric/electrostrictive units 34 are formed on the outer surface of the closure plate 36 of the diaphragm structure 32, such that the units 24 are aligned with the respective pressure chambers 48, as viewed in the plane of the closure plate 36. Each of the P/E units 34 includes a lower electrode 50, a piezoelectric/electrostrictive layer (hereinafter referred to as P/E layer) 52, and an upper electrode 54, which are formed in lamination in this order on the outer surface of the corresponding diaphragm portion of the closure plate 36, by a suitable film-forming method. The P/E units 34 may favorably have any one of structures as proposed in co-pending U.S. patent application Ser. No. 08/239,856 assigned to the assignee of the present application, and in U.S. Pat. No. 5,210,455.

The upper and lower electrode films 54, 50 and P/E layer 52 of each P/E unit 34 are formed on the outer surface of the corresponding diaphragm portion of the closure plate 36 of the diaphragm structure 32, by any one of various known methods including thick-film forming methods, such as screen printing, spraying, dipping and coating, and thin-film forming methods, such as ion-beam method, sputtering, vacuum vapor deposition, ion plating, CVD and plating. The materials used for forming the electrode films 50, 54 and P/E layer 52 may be suitably selected from various known materials and those as disclosed in the above-identified U.S. Patent application and U.S. Patent. The thickness of the P/E unit 34 consisting of the electrode films 50, 54 and P/E layer 52 is generally 100 μm or smaller. The thickness of each electrode film 50, 54 is generally 20 μm or smaller, preferably 5 μm or smaller. The thickness of the P/E layer 52 is preferably 50 μm or smaller, more preferably in the range of 3 μm to 40 μm, so that the diaphragm portion on which the P/E unit 34 is formed can undergo a sufficiently large amount of flexural displacement by applying thereto a relatively low voltage.

In operation of the piezoelectric/electrostrictive film element 30 in which the piezoelectric/electrostrictive units 34 are formed integrally on the respective diaphragm portions (36) of the diaphragm structure 32, the diaphragm portion (36) effectively undergoes flexural displacement upon actuation of the corresponding P/E unit 34, whereby the pressure in the pressure chamber 48 is increased so as to effectively cause a fluid in the pressure chamber 48 to be discharged from the chamber 48.

In the above-described example using the diaphragm structure 32 produced according to the present invention, the diaphragm portions (36) which bear the P/E units 34 thereon protrude outwards, assuming a generally convex shape, and the rigidness, mechanical strength and natural resonance frequency of the diaphragm portions (36) are therefore effectively increased. Accordingly, the operating response of the diaphragm portions (36) is enhanced, and strains and stresses arising in the P/E unit 34 can be converted with high efficiency into displacement of the corresponding diaphragm portion (36). Further, the amounts of protrusion of the convex diaphragm portions (36) are effectively controlled to a predetermined target value with high uniformity, with a result of a reduced variation in the characteristics of individual diaphragm structures or diaphragm portions. For example, the amount of displacement of the diaphragm portions does not vary depending upon the state of activation of the P/E units 34, assuring high uniformity in the displacement amount and quality of the piezoelectric electrostrictive film element 30. The film element constructed as described above may also be used as a sensor which generates a voltage signal indicative of flexural displacement or force that is detected at the diaphragm portion.

While the ceramic diaphragm structure produced according to the present invention is advantageously used as a component of the piezoelectric/electrostrictive film element of the above example, it is to be understood that the diaphragm structure may also be used for other types of piezoelectric/electrostrictive film elements, or for loudspeakers, sensors, vibrators, resonators, filters, display devices and transformers, for example. Further, the present diaphragm structure may be advantageously, used as a component of uni-morph, bi-morph or other types of piezoelectric/electrostrictive actuators, which are used for servo-displacement elements, pulse-driven motors and ultrasonic motors, as described in "FUNDAMENTALS TO APPLICATIONS OF PIEZOELECTRIC/ ELECTROSTRICTIVE ACTUATORS", Kenji Uchino, Japan Industrial Technology Center, published by Morikita Shuppan, Japan.

EXAMPLES

To further clarify the principle of the present invention, there will be described some examples of ceramic diaphragm structures produced according to the present invention. It is however to be understood that the present invention is not limited to the details of the following examples, but may be embodied with various changes, modifications and improvements, which may occur to those skilled in the art, without departing from the scope of the present invention.

Examples 1, 2

To obtain some specimens of diaphragm structures (2) of Examples 1 and 2, there were initially prepared ceramic green sheets (16) and ceramic green substrates (18) in the manners as described below. Each of the diaphragm structures (2) had ten rectangular windows arranged in its longitudinal direction. The windows had a width of 0.5 mm and a length of 0.7 mm, and are arranged such that the 0.7 mm-length sides of adjacent windows are spaced 0.3 mm apart from each other.

| Production of Ceramic Green Substrate (18) | |
|---|---|
| Composition | |
| zirconia powder partially stabilized by 3 mol % yttria (average particle size 0.8 μm) | 100 parts by weight |
| polyvinyl butyral resin (binder) | 9 parts by weight |
| dibutyl phthalate (plasticizer) | 4 parts by weight |
| dispersing agent containing sorbitan fatty acid ester | 2 parts by weight |
| mixture (solvent) of toluene and isopropyl alcohol (50:50 by volume) | 70 parts by weight |

The above ingredients were mixed in a pot mill by an ordinary method, to provide a slurry having the initial viscosity of 1,000 centipoise (cps). The obtained slurry was subjected to a degassing process, and its viscosity was controlled to 10,000 centipoise. Then, the slurry was formed by a doctor blade method into a sheet-like green substrate having the thickness of 200 μm after firing thereof. The green substrate was dried at 80° C. for three hours.

| Production of Ceramic Green Sheet (16) | |
|---|---|
| Composition | |
| zirconia powder partially stabilized by 3 mol % yttria (average particle size 0.8 μm) | 99 parts by weight |
| alumina powder (average particle size 0.2 μm) | 1 part by weight |
| polyvinyl butyral resin (binder) | 11 parts by weight |
| dibutyl phthalate (plasticizer) | 5 parts by weight |
| dispersing agent containing sorbitan fatty acid ester | 2 parts by weight |
| mixture (solvent) of toluene and isopropyl alcohol (50:50 by volume) | 75 parts by weight |

The above ingredients were mixed in a pot mill by an ordinary method, to provide a slurry having the initial viscosity of 1,000 centipoise. The obtained slurry was subjected to a degassing process, and its viscosity was controlled to 3,000 centipoise. Then, the slurry was-formed into a green sheet by means of a reverse roll coater, such that the green sheet provided diaphragm portions (10) having the thickness of 20 μm after firing thereof. The green sheet was dried at 60° C. for 10 min.

The ceramic green substrate (18) obtained in the manner as described above was punched with a metal mold according to a suitable pattern having the windows 20. Then, this green substrate (18) and the ceramic green sheet (16) were superposed on each other, and thermo-compressed under 100 kgf/cm², at 80° C. for 1 min., so as to provide an integral green laminar structure.

Figure 9:
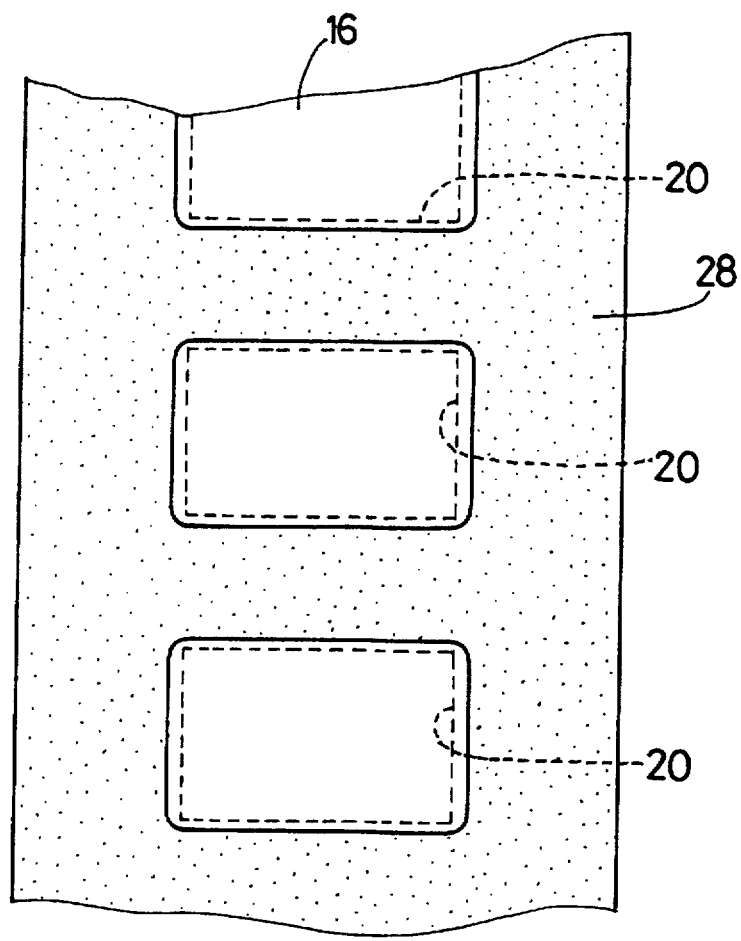
FIG. 9 is a partial plan view showing a pattern of a ceramic green layer formed by printing on a surface of a ceramic green sheet of an integral laminar structure in Examples 1, 3, 5 and 7.

Ten samples of diaphragm structures according to Example 1 of the present invention were produced, using the integral green laminar structure obtained in the above manner, which was further provided with a ceramic green layer (28) giving a frame portion (12) having the thickness of 20 μm after firing thereof. More specifically, the ceramic green layer (28) formed from a paste having the same composition as the slurry for the ceramic green sheet (16) was formed by screen printing on the outer surface of the green sheet (16) of the integral laminar structure, as shown in FIG. 9. As is apparent from this figure, the ceramic green layer (28) was printed on the green sheet (16) so as to surround the diaphragm portions aligned with the windows (20) of the ceramic green body (18).

On the other hand, ten samples of diaphragm structures according to Example 2 of the present invention were produced, using the integral green laminar structure of the ceramic green sheet (16) and green substrate (18), which was not provided with the ceramic green layer (28).

After the green laminar structure of Example 1 with the ceramic green layer (28) for the frame portion (12) was fired at 1500° C. for 2 hours, a ceramic plate (14) formed from a smooth, dense body made of highly pure alumina was placed on one side of the fired body of the laminar structure, from which the diaphragm portions protrude outwards. Then, the laminar structure was heated again under the pressure of the ceramic plate (14), and thus re-fired at 1500° C. for 2 hours. In this manner, the amount of protrusion of the convex diaphragm portions was controlled.

After the green laminar structure of Example 2 with no ceramic green layer (28) was fired at 1500° C. for 2 hours, a jig (22) having 20 μm-height legs (24) was placed on one side of the fired body of the laminar structure, from which the diaphragm portions protrude outwards, as shown in FIG. 5. The jig (22) consisted of a smooth, dense body made of highly pure alumina. Then, the laminar structure was heated under the pressure of the jig (22), and thus re-fired at 1500° C. for 2 hours. In this manner, the amount of protrusion of the convex diaphragm portions was controlled.

With respect to the thus obtained samples of the diaphragm structures according to Examples 1 and 2 of the present invention, the amounts of protrusion of the diaphragm portions were measured, and the average protrusion amount of the ten samples of each Example was obtained. At the same time, the degree of variation or fluctuation of the protrusion amounts among the samples of each Example was obtained. The results of the measurements are indicated in TABLE 1 below. For comparison, a fired body of the green laminar structure provided with the ceramic green layer (28) for forming the frame portion (12) was produced as Comparative Example 1, and a fired body of the green laminar structure that was not provided with the ceramic green layer (28) was produced as Comparative Example 2. The amounts of protrusion of the diaphragm portions with respect to ten samples of each Comparative Example were measured in the same manner, and the average and degree of variation of the protrusion amounts were obtained. The results of the measurements are also indicated in TABLE 1 below.

TABLE 1

| | Amount (h) of Protrusion of Diaphragm portions | |
|---|---|---|
| | Average | Variation ($\sigma_{n-1}$) |
| Example 1 | 21.1 μm | 0.4 μm |
| Example 2 | 22.0 μm | 1.0 μm |
| Comparative Example 1 | 29.7 μm | 3.2 μm |
| Comparative Example 2 | 28.3 μm | 2.8 μm |

It will be understood from the results as shown in TABLE 1 above that the amounts of protrusion of the convex diaphragm portions were averaged and varied to a relatively small extent, for the diaphragm structures of Examples 1 and 2 according to the present invention, due to control of the protrusion amounts by means of the ceramic plate (14) as the flattening jig or the jig (22) with legs.

Then, piezoelectric/electrostrictive units as conventionally used in the art were formed on the outer surfaces of the respective diaphragm portions of the diaphragm structure according to each of Examples 1 and 2 and Comparative Examples 1 and 2, so as to provide a piezoelectric/electrostrictive film element. It was recognized that the degrees of variation of displacement characteristics among different diaphragm portions and among different samples of Examples 1 and 2 were less than half of those of Comparative Examples 1 and 2.

Example 3

The green laminar structure as produced in Example 1 above, which was provided with the ceramic green layer (28) for forming the frame portion (12), was used for this example. The laminar structure was fired at 1500° C. for two hours, while a ceramic plate (14) consisting of a smooth, dense body made of highly pure alumina was disposed in position on the side of the ceramic green sheet (16). The diaphragm portions of the green sheet (16) were protruded outwards as the sintering of the laminar structure proceeded, such that the amount of protrusion was regulated or limited due to abutting contact of the flat surface of the ceramic plate (14) with the protruding diaphragm portions. The average amount of protrusion of the diaphragm portions of the resultant diaphragm structure was 20.5 μm, and the variation of the protrusion amounts was 0.5 μm.

Example 4

The green laminar structure as produced in Example 2 above, which was not provided with the ceramic green layer (28), was used for this example. The laminar structure was fired at 1500° C. for two hours, while the jig (22) with legs as used in Example 2, which was a smooth, dense body of alumina, was positioned on the side of the ceramic green sheet (16). During the firing, the protruding diaphragm portions abutted on the jig (22) with legs, and the amount of protrusion of the diaphragm portions was thus regulated. The average amount of protrusion of the diaphragm portions of the resultant diaphragm structure was 21.5 μm, and the variation of the protrusion amounts was 1.1 μm.

Example 5

To obtain some specimens of diaphragm structure (2) each having ten rectangular windows arranged in the longitudinal direction, as in Examples 1 and 2, there were initially prepared ceramic green sheets (16) and ceramic green substrates (18) in the manners as described below.

| Production of Ceramic Green Substrate (18) | |
|---|---|
| Composition | |
| zirconia powder partially stabilized by 5 mol % yttria (average particle size 0.4 μm) | 100 parts by weight |
| polyvinyl butyral resin (binder) | 12 parts by weight |
| dioctyl phthalate (plasticizer) | 6 parts by weight |
| dispersing agent containing sorbitan fatty acid ester | 2 parts by weight |
| mixture (solvent) of xylene and n-butyl alcohol (50:50 by volume) | 85 parts by weight |

The above ingredients were mixed in a pot mill by an ordinary method, to provide a slurry having the initial viscosity of 1,000 centipoise (cps). The obtained slurry was subjected to a degassing process, and its viscosity was controlled to 10,000 centipoise. Then, the slurry was formed by a doctor blade method into a sheet-like green substrate having the thickness of 200 μm after firing thereof. The green substrate was dried at 80° C. for three hours.

| Production of Ceramic Green Sheet (16) | |
|---|---|
| Composition | |
| zirconia powder partially stabilized by 5 mol % yttria (average particle size 0.3 μm) | 100 parts by weight |
| polyvinyl butyral resin (binder) | 11 parts by weight |
| dioctyl phthalate (plasticizer) | 5 parts by weight |
| dispersing agent containing sorbitan fatty acid ester | 2 parts by weight |
| mixture (solvent) of xylene and n-butyl alcohol (50:50 by volume) | 82 parts by weight |

The above ingredients were mixed in a pot mill by an ordinary method, to provide a slurry having the initial viscosity of 1,000 centipoise. The obtained slurry was then subjected to a degassing process, and its viscosity was controlled to 3,000 centipoise. Then, the slurry was formed into a green sheet by means of a reverse roll coater, such that the green sheet provided diaphragm portions (10) having the thickness of 20 μm after firing thereof. The green sheet was dried at 60° C. for 10 min.

The ceramic green substrate (18) obtained in the manner as described above was punched with a metal mold according to a suitable pattern having the windows 20. Then, the green substrate (18) and the ceramic green sheet (16) were superposed on each other, and thermo-compressed under 100 kgf/cm², at 80° C. for 1 min., so as to provide an integral green laminar structure A. On the surface of the ceramic green sheet (16) of this laminar structure A, there was formed a ceramic green layer (28) by printing, according to a pattern similar to that of FIG. 9, so as to provide a frame portion (12) having the thickness of 20 μm after firing thereof. Thus, the integral green laminar structure B with the green layer (12) was obtained.

Subsequently, air pressure was applied to the integral green laminar structure B with the frame portion, through the windows (20) of the ceramic green substrate (18), so that green diaphragm portions as part of the ceramic green sheet (16), which were aligned with the windows (20), were protruded outwards by an amount of about 35 μm.

Then, the green laminar structure B with the green diaphragm portions thus protruded was fired at 1500° C. for two hours, and a ceramic plate (14) consisting of a smooth, porous body made of highly pure alumina was then superposed on the diaphragm portions of the laminar structure B. In this condition, the laminar structure B was re-heated under the pressure of the ceramic plate (14), and re-fired at 1500° C. for two hours so as to control the amount of protrusion of the convex diaphragm portions to a predetermined target value. The average amount of protrusion of the diaphragm portions of the resultant diaphragm structure was 21.0 μm, and the variation of the protrusion amounts was 0.7 μm. On the other hand, the fired body of the green laminar structure B which was not re-fired under the ceramic plate (14) was formed with the diaphragm portions which protruded by the average amount of 27.5 μm, with a variation of 3.8 μm.

When the integral green laminar structure B with the green diaphragm portions protruded was fired at 1500° C. for two hours, with the ceramic plate (14) consisting of a smooth, porous body made of highly pure alumina being placed on the side of the ceramic green sheet of the laminar structure B, the amounts of protrusion of the diaphragm portions were regulated such that the average thereof was 20.4 μm, and its variation was 0.9 μm.

Example 6

The integral green laminar structure A produced in Example 5 was initially prepared. Then, air pressure was applied to this green laminar structure A, through the windows (20) of the ceramic green substrate (18), so that green diaphragm portions as part of the ceramic green sheet (16), which were aligned with the windows (20), were protruded outwards by an amount of about 35 μm.

Then, the green laminar structure A with the protruding diaphragm portions was fired at 1500° C. for two hours, and a jig (22) having 20 μm-height legs (24) and consisting of a porous, highly pure alumina body was superposed on the ceramic diaphragm plate of the fired laminar structure A, as shown in FIG. 5. In this state, the fired body was re-heated under the weight of the jig (22), and re-fired at 1500° C. for two hours, so as to regulate the amount of protrusion of the convex diaphragm portions. As a result, the average amount of protrusion was 22.1 μm, and the variation of protrusion amounts of different diaphragm portions was 1.2 μm. On the other hand, the fired body of the green laminar structure A which was not re-fired under the jig (22) was formed with the diaphragm portions which protruded by the average amount of 26.7 μm, with a variation of 3.6 μm.

When the integral green laminar structure-A with the green diaphragm portions protruded was fired at 1500° C. for two hours, with the jig (22) having the legs and consisting of a highly pure alumina porous body being placed on the protruding diaphragm portions of the ceramic green sheet of the laminar structure A, the amounts of protrusion of the diaphragm portions were controlled such that the average amount was 21.4 μm, and the variation was 1.3 μm.

Example 7

The integral green laminar structure of the ceramic green sheet (16) and ceramic green substrate (18) as obtained in Example 1 was initially prepared. Then, a ceramic green layer (28) formed from a paste having the same composition as the slurry for the ceramic green sheet (16) was formed by screen printing on the outer surface of the ceramic green sheet (16) of the laminar structure, so as to provide a frame portion (12) having the thickness of 10 μm after firing thereof. After the laminar structure with the ceramic green layer (28) was fired at 1500° C. for two hours, in the same manner as in Example 1, a ceramic plate (15) as a curving jig with a concave abutting surface (15a) was disposed in position on the side of the fired diaphragm structure (2) on which the diaphragm portions (10) protrude outwards. The ceramic plate (15) was formed from a highly pure alumina dense body, and its abutting surface (15a) had a radius of curvature (2268 μm) which was larger than that (1067 μm) of the diaphragm portions (10). In this condition, the diaphragm structure (2) was re-heated under the weight of the ceramic plate (15), and fired at 1500° C. for two hours so as to control the amount of protrusion of the convex diaphragm portions (10).

As a result, the diaphragm portions (10) were formed with respective convex or curved surfaces (10b) having substantially the same radius of curvature of the concave abutting surface (15a) of the ceramic plate (15). The average amount of protrusion of the diaphragm portions (10) was 19.2 μm, and the variation of the protrusion amounts was 0.6 μm.

What is claimed is:

1. A ceramic diaphragm structure comprising:

a ceramic substrate having at least one window;

a ceramic diaphragm plate which is superposed on said ceramic substrate so as to close said at least one window, said diaphragm plate being fired with said ceramic substrate to form an integral sintered body, said diaphragm plate including at least one diaphragm portion which is respectively aligned with said at least one window, each of said at least one diaphragm portion protruding outwards, in a direction away from a corresponding one of said at least one window, said each diaphragm portion having a peripheral part that has a first predetermined radius of curvature and a part including the top of said diaphragm portion, which has a flat surface or a curved surface having a second predetermined radius of curvature greater than said first predetermined radius of curvature.

2. A ceramic diaphragm structure according to claim 1, wherein said ceramic diaphragm plate is formed of a material which contains a major component that is selected from the group consisting of stabilized zirconia, partially stabilized zirconia, alumina, and mixtures thereof.

3. A ceramic diaphragm structure according to claim 1, wherein said ceramic substrate and said ceramic diaphragm plate have an average crystal grain size of not larger than 5 μm.

4. A ceramic diaphragm structure according to claim 1, wherein said at least one diaphragm portion has a thickness of not greater than 30 μm.

5. A ceramic diaphragm structure according to claim 1, wherein said at least one diaphragm portion consists of a dense body having a relative density (bulk density/theoretical density) of at least 90%.

* * * * *